United States Patent [19]

Apel

[11] 4,446,445
[45] May 1, 1984

[54] SINGLY TERMINATED PUSH-PULL DISTRIBUTED AMPLIFIER

[75] Inventor: Thomas R. Apel, Cedar Rapids, Iowa

[73] Assignee: Rockwell International Corporation, El Segundo, Calif.

[21] Appl. No.: 444,283

[22] Filed: Nov. 24, 1982

[51] Int. Cl.³ .............................................. H03F 3/60
[52] U.S. Cl. .................................... 330/269; 330/286
[58] Field of Search ................ 330/55, 264, 269, 286, 330/307

[56] References Cited

U.S. PATENT DOCUMENTS 4,072,979 2/1978 Palara ............................ 330/307 X
4,097,814 6/1978 Cohn .................................... 330/286

OTHER PUBLICATIONS

Matthaei, George L., *Microwave Filters, Impedance Matchers and Coupling Structures*, pp. 49–81.
Ginzton et al., "Distributed Amplification", *Proceedings of the IRE*, Aug. 1948.
Ayasli et al., "Monolithic GaAs 1–13-GHz Traveling Wave Amp", *IEEE Trans on Microwave T&T #7*, 7/82.
Strid et al., "A DC-12 GHz Monolithic GaAsFET Distributed Amp", *IEEE Trans. on Microwave T&T #7*, 7/82.

*Primary Examiner*—James B. Mullins
*Assistant Examiner*—Steven J. Mottola
*Attorney, Agent, or Firm*—Robert C. Mayes; George A. Montanye; H. Fredrick Hamann

[57] ABSTRACT

A broadband distributed push-pull amplifier capable of amplifying frequencies from zero to 20 Gigahertz is disclosed having a singly terminated output. The singly terminated construction of the amplifier precludes the need for a termination resistor on the output, and thereby enables substantially all the output power to be utilized.

13 Claims, 2 Drawing Figures

SINGLY TERMINATED PUSH-PULL DISTRIBUTED AMPLIFIER

CROSS REFERENCE

Cross-reference is made to related application Ser. No. 444,290, entitled "Singly Terminated Distributed Amplifier", filed on even date herewith.

BACKGROUND OF THE INVENTION

The "distributed amplifier" has been used for extremely broadband amplifiers and which have a flat frequency response from essentially direct current all the way to as high as several tens of Gigahertz. The use of the distributed amplifier or traveling wave amplifier was reported by Edward L. Ginzton, et. al., in a paper entitled "Distributed Amplification" published August, 1948 in the *Proceedings of the IRE*. The concepts in that paper are useful background for the present invention and that paper is incorporated herein by reference thereto.

That paper mentions, on page 962 under the heading "Tapered Plate Lines" an impedance matching technique for a vacuum tube circuit which enables several distributed amplifier stages to be coupled to maximize the gain by properly matching the impedance from one stage to the next.

More recently, several articles have been published relating to distributed amplifiers and traveling wave amplifiers having an integrated circuit structure in keeping with the advance of technology in this area. However, a continuing problem exists with respect to having a major portion of the output power being dissipated in the internal drain circuit termination. A paper entitled "A DC-12 GHz Monolithic GaAs FET Distributed Amplifier" by Eric Strid, et. al., published July 1982 in the *IEEE Transactions on Microwave Theory and Techniques* shows a method of manufacturing a state-of-the-art distributed amplifier. A second paper entitled "A Monolithic GaAs 1-13 GHz Traveling Wave Amplifier" by Yalcin Ayasli, et. al., published July 1982, *IEEE Transactions on Microwave Theory and Techniques* discloses again a doubly terminated technique wherein at certain frequencies, significant portions of the output power are diverted through the output termination and thereby approximately 50% of the output power is wasted.

To improve the understandng of the "image method" for filter design utilized in the above incorporated publications as well as in the present application, chapter 3 entitled "Principles of the Image Method for Filter Design" from a leading text in this area entitled *Microwave Filters, Impedance-Matching Networks, and Coupling Structures* by George L. Matthaei, et. al., is recommended as useful background and chapter 3, pages 49 to 81, of that text hereby incorporated by reference.

SUMMARY OF THE INVENTION AND BRIEF DESCRIPTION OF THE DRAWINGS

Accordingly, it is an object of the present invention to provide a monolithic push-pull distributed amplifier having a singly terminated and balanced output.

Another object of the present invention is to provide a push-pull traveling wave amplifier wherein essentially all of the output power is provided to the output in a phase opposition manner, precluding the need for an internal termination resistance.

Briefly, in accordance with the present invention, a push-pull distributed amplifier has a singly terminated output and comprises an integrated circuit substrate, a first plurality of active amplifier devices and a second plurality of active amplifier devices, both mounted on the substrate with electrical interconnection of each of the active amplifier devices in each of said plurality of active amplifier devices are connected each to the others to form an amplifier stage and said first plurality and second plurality are electrically interconnected to form a push-pull configuration, and the electrical interconnection has a phase difference between the active devices, resulting in substantially all of the amplifier power being output to the singly terminated output. The devices are interconnected wherein the gate or input connections are essentially in parallel (at the lower frequencies) and the output or drain connections are cascaded with an increasing capacitive susceptance toward the output and a decreasing inductive reactance toward the output, resulting in the requirement for a single termination, essentially the load, and therefore an increased gain as well as eliminating the requirement for a drain termination resistor on the integrated circuit or interconnection provisions for connection to the drain termination resistor.

A plurality of amplification stages, each having several amplifiers, are connected in one embodiment, to further increase the gain of the overall device.

The frequency response of a device built in accordance with the present invention is from zero to 20 GHz, and by utlization of metal oxide capacitors for the capacitive reactance change on the device, and the use of controlled wire bonding or photolithographic metalization on the integrated circuit to control the inductive reactance change, the entire device is manufactured on a single integrated circuit.

DETAILED DESCRIPTION OF THE INVENTION

Figure 1:
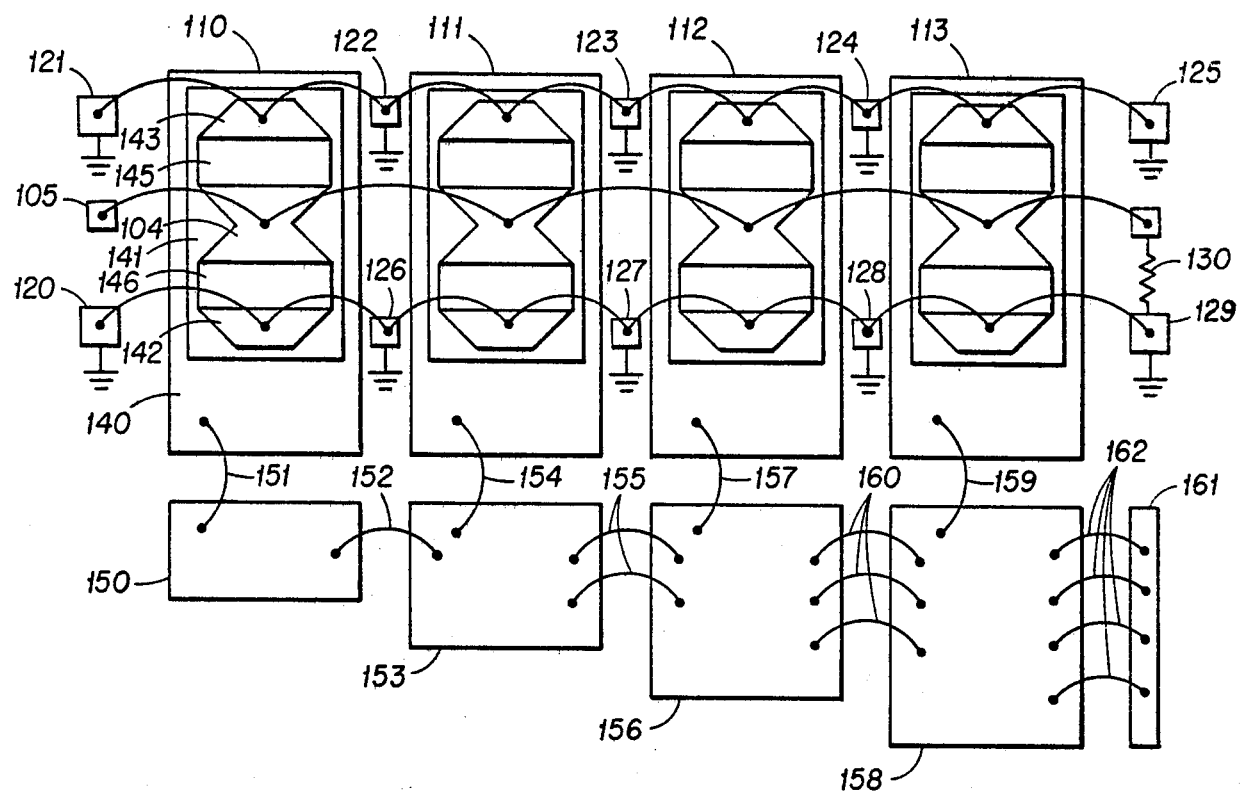
FIG. 1 is a schematic diagram of a push-pull distributed amplifier in accordance with the present invention.
Figure 1:
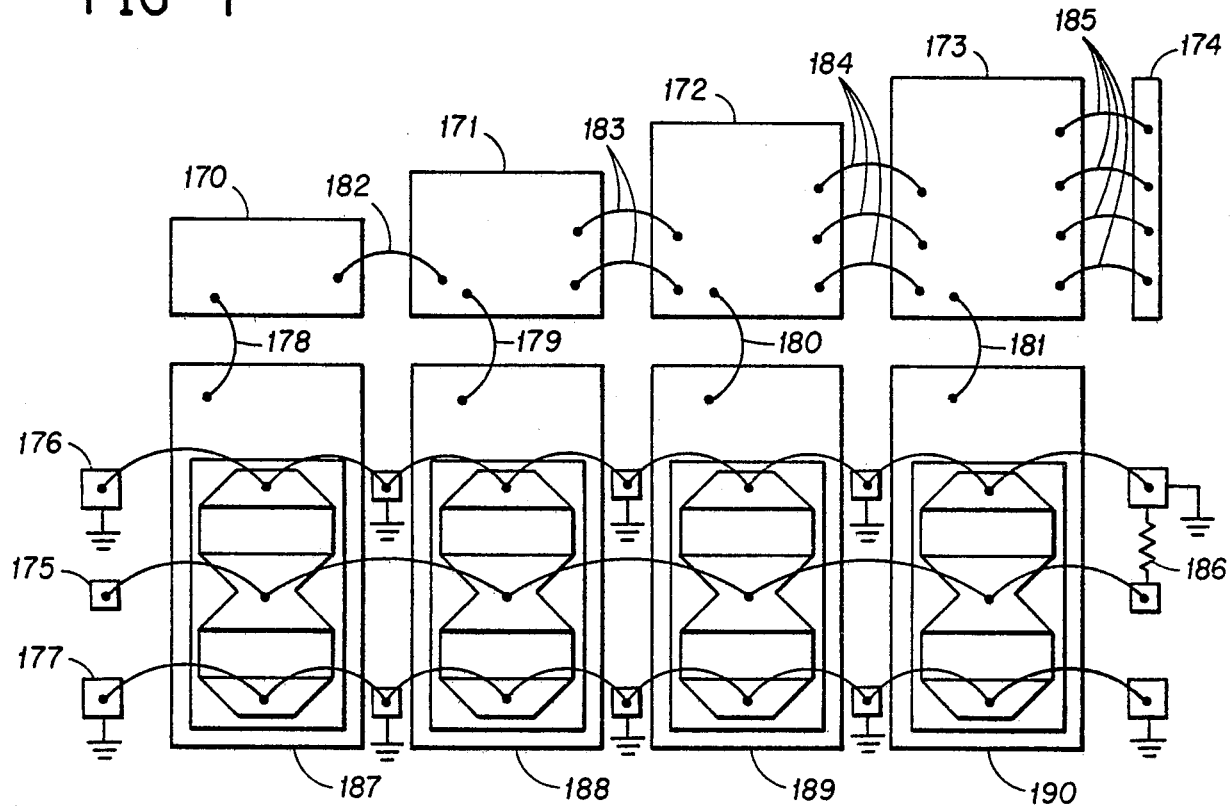

Referring now to FIG. 1, one embodiment of the present invention is shown utilizing N-channel metal oxide silicon field effect transistors 110, 111, 112, and 113 on one side of the push-pull, and transistors 187, 188, 189 and 190 on the other side of the push-pull amplifier, shown as they are constructed on a single substrate. In the shown embodiment, the transistor 110 has dual sourcing 143 and 142 and a single gate 104. Each of the transistors 111, 112 and 113 as well as 187, 188, 189 and 190 are essentially similar to the construction of transistor 110 and each is dual sourced in the following manner. The four transistors comprising the "A" stage are transistors 110, 111, 112 and 113. These transistors are connected through a dual source to ground connection comprising an essentially continuous wire bond connected at grounding pads 121, 122, 123 124, and 125. The second source of each of these "A" transistors are connected to ground pads 120, 126, 127, 128 and 129. The "B" transistor stage comprising transistors 187, 188, 189, and 190 are also connected to ground at the sources to ground pad 177 and the second source of each of those transistors is connected to ground pad 176 as well as sufficient other ground connections to maintain ground voltage potential at the source.

The gates or amplifier inputs are connected in electrical parallel and in the "A" stage, input pad 105 is wire bonded to gate 104 and from there to each of the gates of the amplifier and also to the gate termination resistor 130. The "B" stage has the input connection at pad 175 wire bonded to the gate of transistor 187 and from there to each of the gates of the other transistors in that stage to termination resistor 186.

Regions 145 and 146 on transistor 110 are active regions and region 141 is an isolation region for providing insulation between the gate, active region and the source of the devices as well as from drain region 140.

As previously stated, all of the transistors in FIG. 1 are constructed similarly to transistor 110 and therefore operate in a similar manner. The bond wire 151 connects the drain 140 of transistor 110 to the metalization 150 and furthermore, metalization 150 is connected through bond wire 152 to metalization 153. The bond wire 154 connects the drain of transistor 111 to the metalization 153 as does bond wire 157 connect the drain of transistor 112 to the metalization 156 and bond wire 159 connect the drain of transistor 113 to metalization 158.

It can be seen that the wire bond proceeding from the metalization 150 to 153 consists of a single bond wire. When proceeding from metalization 153 to 156, there are two bond wires 155 and from metalization 156 to 158 there are four bond wires 160. Finally, in the present embodiment, there are four bond wires 162 going for metalization 158 to the output pad 161. This increasing in the number of bond wires from one output capacitor to the next results in an inductive reactance decrease as a direct function of the number of active devices in the amplifier. For example, the third transistor from the input, transistor 112 from input 105, utilizes three bond wires 160 to connect to the fourth transistor 113 in the amplifier, and therefore the inductance reactance decreases, in the output combiner circuit, from each of the amplifiers to the next as a direct function of the number of active devices in the amplifier.

Additionally, the size of the metalization patterns 150, 153, 156 and 158 increases resulting in a capacitive reactance decrease also as a direct function of the number of active devices. The capacitive susceptance (the reciprocal of reactance) therefore increases as a direct function of the number of active devices.

The phase relationships of one output node to the next are substantially uniform even though the impedance decreases towards the output. This enables the amplifier to produce substantially greater output power than a doubly terminated amplifier since there is no loss of power in an internal termination or "dummy" resistor. The use of image parameter theory and constant-k derivation for developing an equivalent circuit of a transmission line model enables the designer to prescribe the desired capacitance and inductance for the circuit to achieve a specified operating characteristic. The use of M-derived sections is also helpful as described in the Matthaei text, to obtain equivalent circuit parameters when desired.

In this specification, the "A" stage or side of the amplifier refers to the side having transistors 110, 111, 112, and 113, and similarly the "B" stage or side of the amplifier refers to the side of the amplifier having transistors 187, 188, 189 and 190. Additionally, in this push-pull configuration, the phase relationships of the "A" stage compared with that of the corresponding "B" stage will essentially be 180° in opposition. This amplifier circuit has two substantially identical signal branches, connected to operate in phase opposition and with their input and output connections each balanced to ground. This circuit then contains two like elements which operate in 180° phase relationship to produce additive output components of the desired wave and cancellation of certain unwanted wave components. This amplifier design has the primary advantages of increased power output as compared to a single or parallel configuration and the advantage of reduction of second harmonic content in the output.

The "A" stage and the "B" stage of the push-pull amplifier are essentially mirror-images of each other, and the input is applied across pad 105 and 175 to provide a balanced output across pads 161 and 174. Stage, as used in this application, means either the "A" or the "B" side of the push-pull amplifier, and includes at least two active devices, (four are shown) connected in a distributed amplifier configuration.

Figure 2:
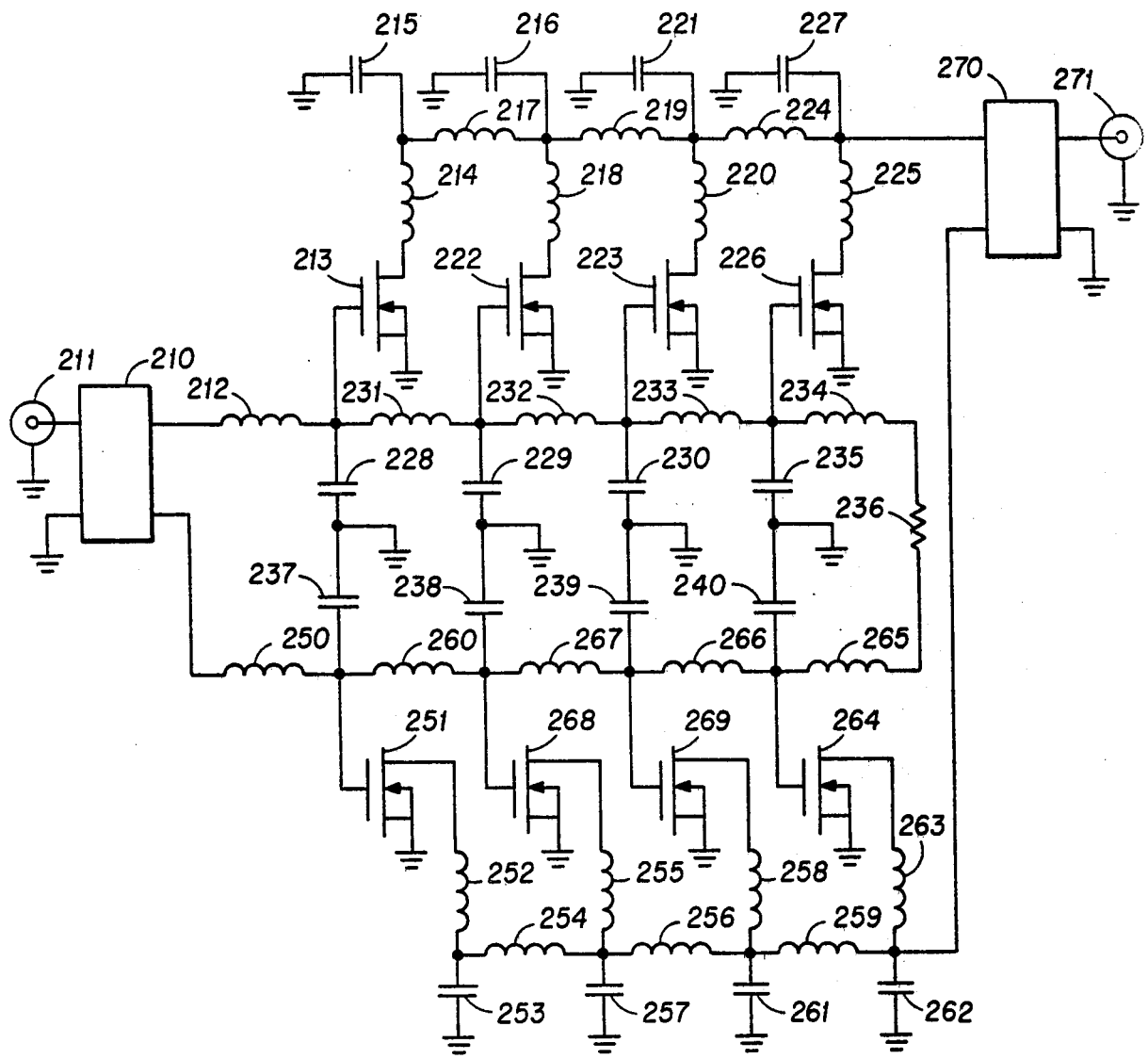
FIG. 2 is a schematic equivalent circuit diagram of the amplifier shown in FIG. 1 wherein the impedance of the wire bonding and the capacitance of the various circuit components are shown.

Referring now to FIG. 2, an equivalent circuit diagram is shown representing the device in FIG. 1. The grounded source MOSFETs 213, 222, 223, and 226 correspond to transistors 110, 111, 112, and 113 in FIG. 1. The input 211 is a shielded cable connection into balun 210 and thereafter a balanced signal is provided to both sides of the push-pull amplifier, the "A" side signal traveling through inductor 212 representing the inductance of the metalization going into the gate of transistor 213 and the inductor 250 on the "B" side representing the inductance going into the gate of transistor 251. The gates of MOSFETs in FIG. 2 are connected by inductances 231, 232, 233 and 234 to the internal termination resistor 236 and to the gates of the transistors on the "B" side through inductors 265, 266, 267, 260 and additionally to inductor 250. The internal gate termination resistor 236 corresponds to the gate termination resistors 130 and 186 in FIG. 1. Since both termination resistors are grounded, the net effect as shown in FIG. 2 is a series resistance connection and resistor 236 has a value of 50 ohms. The inductances between the gates of the MOSFETs are primarily a result of the bond wire inductance. The capacitors 228, 229, 230, 235, 240, 239, 238 and 237 represent the capacitance from the gate of the respective transistor to ground resulting from both the internal capacitance of the device and the metalization capacitance to ground.

In determining the values for the relative lumped impedances and capacitances in the circuit in a manner that facilitates operational design, the image parameter method and constant-k filter equivalent circuit derivation method was utilized. These methods are explained in depth in chapter 3 of the above-referenced Matthai text previously incorporated herein by reference. The derivation of the values for a singly terminated amplifier is contained in the disclosure of the co-pending application entitled "Singly Terminated Distributed Amplifier", cross-referenced above. That disclosure is hereby incorporated by reference thereto.

The following design parameter are fixed in this exemplary embodiment for purposes of description only. The desired input port resistance is set at 50 ohms, and this requires that the square root of the quantity $L_k/C_k$ is equal to 25 ohms, since the input port of the push-pull amplifier is essentially the sum of the input impedances of each side.

Additionally, the operating frequency desired in this exemplary embodiment is set at $10^{10}$ radians per second or $1.59 \times 10^9$ Hz, and this is equal to the quantity 1/[square root of $(L_k C_k)$]. Solving for $L_k$ in each of the above formulas, we obtain $L_k$ equals $25^2 C_k$ and $L_k$ equals $1/10^{20}/C_k$. Setting these equal provides $25^2 C_k$ equals $1/10^{20}(C_k)$ and therefore, $C_k$ equals 4 picofarads. Inserting $C_k$ into either of the above formulas provides $L_k$ equal to 2.5 nanohenries.

The value of the input gate shunt capacitance is calculated in the following manner: the desired shunt capacitance from the equivalent circuit calculations equals $2C_k$ and $C_k$ equals 4 picofarads; therefore, the shunt capacitor equals 8 picofarads. Since the input gate of each of the devices has an internal capacitance of 1 picofarad in the exemplary devices, N-channel MOSFETs, 8 picofarads minus 1 picofarad requires 7 picofared external to the device and therefore each of the capacitors 228, 229, 230 and 235 as well as the corresponding shunt capacitors on the "B" side, 237, 238, 239, and 240 are all required to be 7 picofarads.

The value of the impedances and capacitances utilized in the equivalent circuit are 2.5 nanohenries for inductor 212 and inductor 250 providing an overall input inductance of 5 nanohenries, and 5 nanohenries each for inductors 231, 232, 233 and 260, 267 and 266. Inductors 234 and 265 are 2.5 nanohenries each.

In order that the push-pull distributed amplifier will interface with a 50 ohm load, the "A" and "B" sides must each be designed to interface with one-half of 50 ohms, or 25 ohms. Hence, the output network design is predicated on $4 \times 25$ ohms or 100 ohms and $10^{10}$ radians/second. Inductors 214, 218, 220 and 225 as well as inductors 263, 258, 255, and 252 have a value of 20 nanohenries, $L_k$ (output net)=4 $L_k$ (input net) and $C_k$ (output net)=$C_k$ (input net)$\div 4$=1 picofarad. The single termination at the output side of the push-pull distributed amplifier requires decreasing values of the reactance in the output of each of the devices proceeding from the input side to the output. The value for the drain net capacitance is given by the formula $2N(C_k)$ where N equals the number of the device beginning with the input side moving toward the output. Therefore, the value of capacitor 215 and capacitor 253 is equal to 2 $C_k$ and since $C_k$ equals 1 picofarad, the value of those capacitors is 2 picofarads. Similarly, the value for capacitor 216 and capacitor 257 is calculated to be 4 picofarads and the values of capacitors 221 and 261 are calculated to be 6 picofarads. While this embodiment utilizes a four device per side configuration, the invention is not limited to such construction and five, six or more devices may be coupled on each side of a push-pull amplifier to attain similar advantages. The last device in the amplifier prior to the output, however, will have a value given by the formula $N(C)/2$ where C is equal to $2(C_k)$, N is equal to the number of devices, and therefore the value for capacitors 227 and 262 is given as 4 picofarads each.

Inductor 217 and inductor 260 each have a value of 20 nanohenries. Inductors 256 and 219 each have a value of 10 nanohenries or $2(L_k)/2$, and inductors 224 and 259 have a value of 6.67 nanohenries which is equal to $2(L_k)/3$. Again, this calculation proceeds to as many devices as are contained in the given amplifier design.

Balun 270 provides an unbalanced output to coax connector 271 with an output impedance of 50 ohms.

It should be noted in this embodiment that the wire bonding is used to control the inductive values of the interconnection between the devices in the stage; however, photolithographic techniques providing metalized interconnection lines utilizing a photoetch and deposition process such as sputtering, for example, may also be used if the metalization is controllable to the extent that the inductive reactance value may be closely controlled.

Gallium arsenide devices, as well as other compositions of substrate material may be utilized, and additionally the various channel types and modes may result in alternative embodiments and various values for $C_k$ resulting in changes to the design values for $L_k$ to result in a proper operating frequency. These values are derived in a known manner as described in the section entitled "The Constant-k Derived Values from the Image Point of View" in chapter 3 of the above-referenced Matthaei text.

A significant advantage of the present embodiment is elimination of the requirement for a drain termination resistor resulting in substantially all of the power output from each of the devices in the amlifier stage being delivered to the stage output. The savings in output power are significant resulting in improvements in amplifier gain, and the lessened need for substrate area to provide an internal termination resistor or in the alternative, saving the interconnect area to an external resistor providing sufficient resistance to handle 50% of the design load.

Additional significant advantages of the push-pull configuration are the higher port impedances (approximately double) of the push-pull configuration over the single-sided configuration as described in the above referenced paper entitled "A DC-12 GHz Monolithic Gallium Arsenide FET Distributed Amplifier"]by Eric Strid.

A further advantage of the push-pull configuration is the even harmonics are effectively cancelled since the phase relationships of the "A" side relative to the "B" side are substantially in-phase at those even harmonic frequencies.

For a given power level, the port impedance of the disclosed device will be approximately four times greater than that of a single sided amplifier having the same number of device stages and effectively increases the output impedance while maintaining the same power level.

While the present description of the invention is made with respect to a specific embodiment, it can be seen that the circuit technique is not limited to that embodiment, but may be adapted to a variety of applications and devices such as MESFETs, JFETs, and others as may become obvious to those skilled in the art. Since modifications to the foregoing description may occur to those skilled in the art which very well may not constitute a departure from the scope and spirit of the invention, the description is intended to be merely exemplary and it is therefore contemplated that the appended claims will cover any such modification of embodiments as fall within the true scope of the invention.

What is claimed is:

1. A push-pull distributed amplifier having a singly terminated output comprising:
   a. an integrated circuit substrate;
   b. a plurality of active amplifier devices mounted on said substrate in two related sections, each section having electrical interconnection of that sections active amplifier devices, each to the others, to form a distributed amplifier; and having said sections interconnected to form a push-pull distributed amplifier; and c. said electrical interconnection within said section having a reactance difference between said active devices resulting in substantially all of the amplifier power being output to said singly terminated output.

2. An integrated circuit comprising:
a. a first plurality of amplifying means and a related second plurality of amplifying means mounted on a semiconductor substrate, said means for amplifying an input signal; and
b. means for interconnection of said amplifying means in said first plurality and means for interconnection of said amplifying means in said second plurality, each to the others, to form two amplification stages, said stages constructed in push-pull configuration, said means for interconnection further having a dissimilar reactance within each plurality, for each connection from the reactance of the others within that plurality, the dissimilarity a function of the number of amplifying means in said stages.

3. An integrated circuit as in claim 2 further comprising a plurality of push-pull amplifiers connected in cascade.

4. An integrated circuit as in claim 2 wherein said input signal has a frequency from zero to 20 Gigahertz.

5. An integrated circuit as in claim 2 wherein said means for interconnection comprises metal oxide capacitors.

6. An integrated circuit as in claim 2 wherein said means for interconnection comprises wire bonding.

7. An integrated circuit as in claim 2 wherein said means for interconnection comprises photolithographic metalization.

8. An integrated circuit as in claim 2 wherein said means for amplifying comprises N-channel field effect transistors.

9. A push-pull traveling wave amplifier comprising:
a. a plurality of amplifying devices on a single substrate formed in two related sections, wherein each of said devices in a section is interconnected with the others and to a singly terminated output and said sections are interconnected to form a push-pull configuration; and
b. a phase difference in said interconnections, eash from the others, such that substantially all of the power from said devices is output to said singly terminated output, said phase difference having a capacitive susceptance increasing toward the output and having an inductive reactance decreasing toward the output, from one device to the next, as a direct function of the number of amplifying devices.

10. An amplifier as in claim 9 wherein said interconnections comprise metal oxide capacitors.

11. An amplifier as in claim 9 wherein said interconnections comprise wire bonding.

12. An amplifier as in claim 9 wherein said interconnections comprise photolithographic metalization.

13. An amplifier as in claim 9 wherein said amplifying devices comprise N-channel field effect transistors.

* * * * *